United States Patent
Takahashi et al.

(10) Patent No.: US 8,741,510 B2
(45) Date of Patent: Jun. 3, 2014

(54) METHOD OF CALCULATING AMOUNT OF FLUCTUATION OF IMAGING CHARACTERISTIC OF PROJECTION OPTICAL SYSTEM, EXPOSURE APPARATUS, AND METHOD OF FABRICATING DEVICE

(71) Applicant: Canon Kabushiki Kaisha, Tokyo (JP)

(72) Inventors: Rika Takahashi, Utsunomiya (JP); Atsushi Shigenobu, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/685,915

(22) Filed: Nov. 27, 2012

(65) Prior Publication Data

US 2013/0137050 A1 May 30, 2013

(30) Foreign Application Priority Data

Nov. 30, 2011 (JP) ................... 2011-262273

(51) Int. Cl.
*G03F 7/20* (2006.01)
(52) U.S. Cl.
CPC ................... *G03F 7/70575* (2013.01)
USPC .......................................... 430/30

(58) Field of Classification Search
CPC ........................ G03F 7/7055; G03F 7/70575
USPC ........................................... 430/30
See application file for complete search history.

(56) References Cited

FOREIGN PATENT DOCUMENTS

| JP | 821531 B | 3/1996 |
|---|---|---|
| JP | 2003203853 A | 7/2003 |

*Primary Examiner* — Christopher Young
(74) *Attorney, Agent, or Firm* — Canon USA Inc. IP Division

(57) ABSTRACT

In a case where a substrate is exposed to exposure light of a first wavelength band, an exposure coefficient, which is defined as an amount of fluctuation of an imaging characteristic of a projection optical system per unit of exposure energy, for the first wavelength band is calculated using data of the amount of fluctuation of the optical characteristic of the projection optical system. An exposure coefficient for a second wavelength band that is different from the first wavelength band is calculated using the exposure coefficient for the first wavelength band. In a case where the substrate is exposed to exposure light of the second wavelength band, the amount of fluctuation of the imaging characteristic of the projection optical system is calculated using the exposure coefficient for the second wavelength band.

5 Claims, 5 Drawing Sheets

METHOD OF CALCULATING AMOUNT OF FLUCTUATION OF IMAGING CHARACTERISTIC OF PROJECTION OPTICAL SYSTEM, EXPOSURE APPARATUS, AND METHOD OF FABRICATING DEVICE

BACKGROUND OF THE INVENTION

1. Field of the Invention

The present invention relates to a method of calculating the amount of fluctuation of an imaging characteristic of a projection optical system, an exposure apparatus, and a method of fabricating a device.

2. Description of the Related Art

A reduction projection exposure apparatuses are used in processes of fabricating semiconductor devices. The reduction projection exposure apparatuses illuminate a mask (reticle) using light from a light source so as to project an image of a pattern formed on the mask onto a wafer, onto which a photoresist has been applied, with the size of the pattern reduced.

Japanese Patent Laid-Open No. 2003-203853 (referred to as "reference 1" hereafter) describes an exposure apparatus with which a substrate is exposed to exposure light of two wavelength bands. When the exposure light of two wavelength bands is used, a resist applied onto the substrate can be exposed to an increased amount of exposure light. However, the amount of energy exerted on a projection optical system is also increased. It is known that optical characteristics such as a refractive index of the projection optical system, when the projection optical system absorbs part of exposure energy, fluctuates due to temperature change in the projection optical system caused by heat produced through the absorption of the exposure energy.

When the projection optical system continuously operates with the exposure light for a long time or operates with the exposure light of high illuminance, fluctuation of the optical characteristics of the projection optical system increases. Illuminance is generally understood as the amount of luminous flux incident on a surface per unit area. As a result, fluctuation of imaging characteristics of the projection optical system such as aberrations, focusing, and magnifications increases, thereby causing non-negligible amounts of defocusing and misalignment to occur. In order to suppress such fluctuations, methods of correcting fluctuation of imaging characteristics of the projection optical system being exposed to exposure energy have been proposed (reference 1 and Japanese Patent Publication No. 8-21531 (referred to as reference 2 hereafter)).

According to reference 1, fluctuation information presenting the relationships between the amount of time, for which the projection optical system is irradiated with the exposure light, and the amount of fluctuation of aberration is obtained in advance for wavelength bands including the wavelengths of the exposure light (for example, a wavelength of the i-line or bandwidth including the g-line, h-line, and i-line), and imaging characteristics of the projection optical system are corrected using the fluctuation information.

Reference 2 describes a computation of the amount of fluctuation using a model expression (function) that represents the amount of fluctuation of an imaging characteristic of the projection optical system.

The fluctuation information described in reference 1 is obtained in advance for wavelength bands including exposure light and stored in a storage device. The amount of fluctuation of the imaging characteristic of the projection optical system changes when the wavelength band and the intensity of the exposure light to be used change. For this reason, with the technology described in reference 1, the amount of fluctuation of the imaging characteristic of the projection optical system can be estimated only when the exposure light is of a wavelength band and light intensity obtained in advance. That is, changes in wavelength band and light intensity are not considered, and accordingly, there is an error in estimating the amount of fluctuation in the case where the wavelength or the light intensity changes.

According to the technology described in reference 2, the wavelength band of the exposure light is not considered, and accordingly, it is impossible to obtain the amount of fluctuation of an imaging characteristic of the projection optical system corresponding to the wavelength band of the exposure light.

Thus, with respect to an imaging characteristic of the projection optical system, there may be an error occurring between the estimated amount of fluctuation and an actual amount of fluctuation, and highly precise correction of the imaging characteristic of the projection optical system cannot be performed.

SUMMARY OF THE INVENTION

With the present invention, the amount of fluctuation of an imaging characteristic of a projection optical system is more correctly obtained.

Further features of the present invention will become apparent from the following description of exemplary embodiments with reference to the attached drawings.

DESCRIPTION OF THE EMBODIMENTS

An embodiment of the present invention will be described in detail below with reference to the drawings.

Imaging characteristics referred to herein include at least one of focusing, magnification, distortion, astigmatism, spherical aberration, coma aberration, distortion aberration, curvature of field, and wave aberration. An aberration mainly including astigmatism, spherical aberration, or coma aberration can be represented as a term expressed in Zernike polynomials. The astigmatism, spherical aberration, coma aberration, distortion aberration, and curvature of field may be collectively referred to as "aberration". The optical characteristics represent the refractive index and transmittance.

First Embodiment

Figure 1:
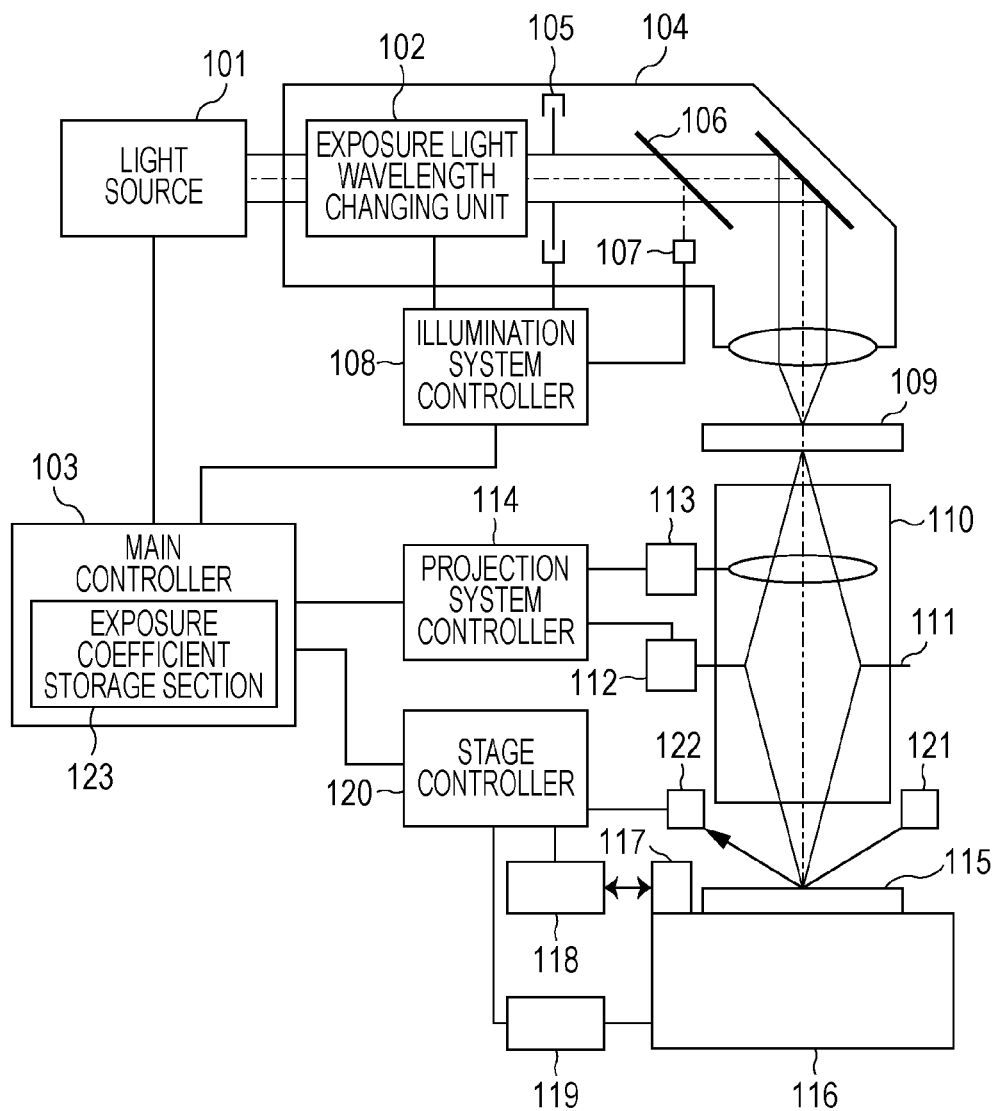
FIG. 1 is a schematic diagram of an exposure apparatus.

FIG. 1 is a schematic diagram of the structure of an exposure apparatus.

A light source 101 emits light as exposure light at a plurality of wavelengths. Herein, the term "wavelength" may refer to a bandwidth of a certain range of wavelengths in addition to a wavelength of a specific value. The light source uses, for example, a light source that emits light of a bandwidth including the i-line and h-line, a light source that emits light of a bandwidth including the g-line, h-line, and i-line, or the like.

Figure 2:
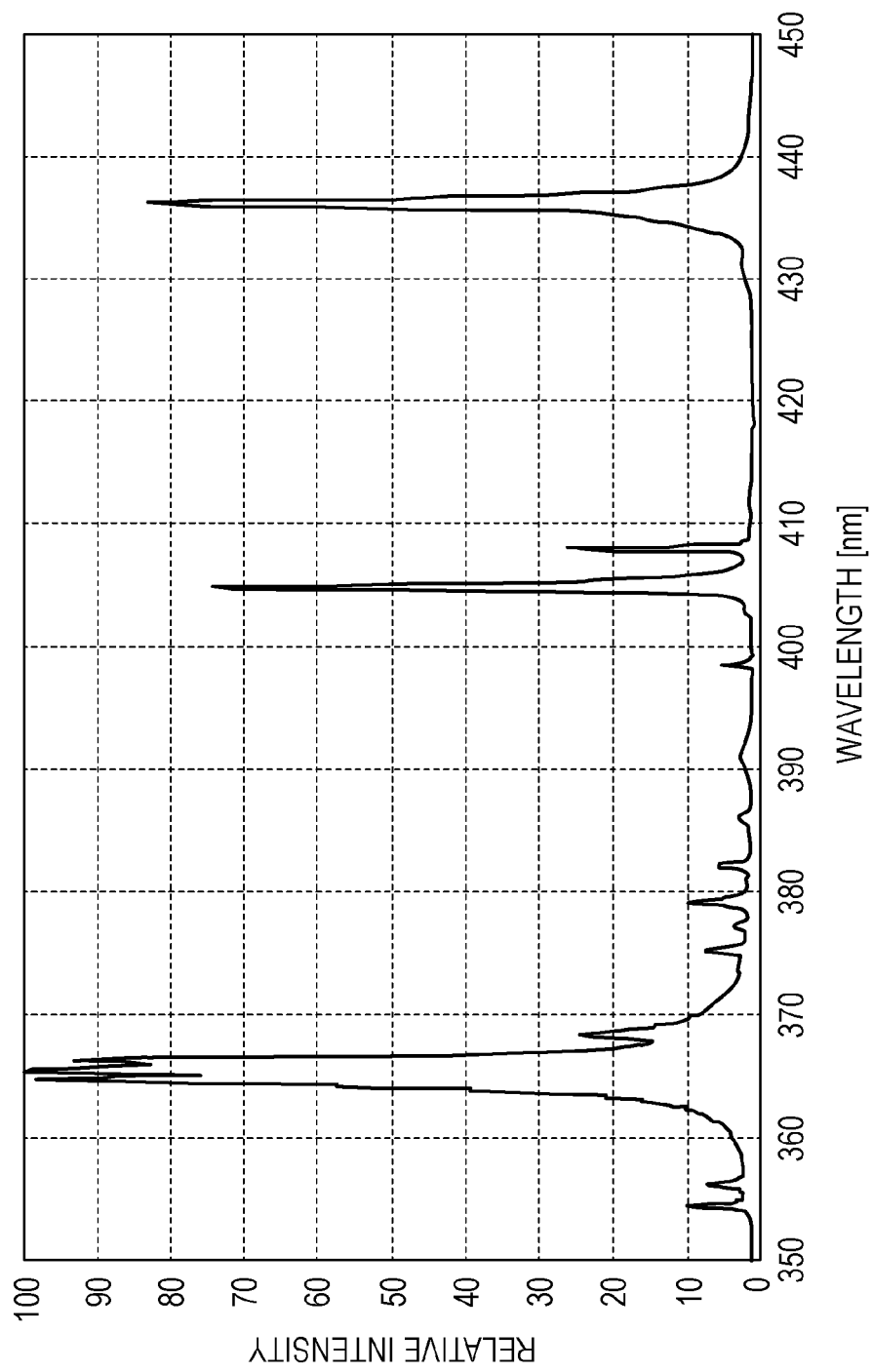
FIG. 2 illustrates the spectrum of light from a light source.

FIG. 2 illustrates the spectrum of light emitted from the light source 101. Here, the spectrum of light emitted from a super-high-pressure ultra-violet (UV) lamp as the light source 101 is described. The super-high-pressure UV lamp has emission lines (peaks) at the wavelengths of the i-line (365.0 nm), h-line (404.7 nm), and g-line (435.8 nm). Thus, the light emitted from the light source 101 has the peaks (emission lines) at a plurality of wavelengths.

An illumination optical system 104, which illuminates a mask 109 using light emitted from the light source 101, includes an exposure light wavelength changing unit 102. The exposure light wavelength changing unit 102 can change the wavelength of the exposure light, which illuminates the mask 109 and a substrate (wafer). The exposure light wavelength changing unit 102 includes a plurality of types of filters that allow light of different wavelength bands to be transmitted therethrough. These filters include such filters as that allow light of a specific wavelength band or wavelength bands (for example, a wavelength band including only the i-line, and a wavelength band including only the i-line and h-line) to be transmitted therethrough. The filters are switched so as to be arranged in one or a plurality of optical paths. The filters may use band-pass filters, short-pass filters, long-pass filters, and the like.

The light emitted from the light source 101 passes through a beam shaping optical unit (not shown) of the illumination optical system 104 so as to be shaped into a specified beam shape. The shaped beam of light is incident upon an optical integrator (not shown), which forms multiple secondary light sources in order to illuminate the mask 109 at a uniform illumination distribution.

An aperture stop 105 having a substantially circular shape is disposed on a pupil plane of the illumination optical system 104. An illumination system controller 108 can control the size of an opening of the aperture stop 105 so as to set the numerical aperture (NA) of the illumination optical system 104 to a specified value. Since the ratio of the numerical aperture of the illumination optical system 104 to the numerical aperture of a projection optical system 110, which will be described later, represents the coherence factor (σ value), the illumination system controller 108 can set the σ value by controlling the aperture stop 105.

A beam splitter 106 is disposed in an optical path of the illumination optical system 104. Part of the exposure light that is to illuminate the mask 109 is reflected by the beam splitter 106 so as to be extracted. A photosensor 107 is disposed in an optical path of the light reflected by the beam splitter 106. The photosensor 107 outputs an electrical signal in accordance with the intensity of light (exposure energy) from the light source 101.

An output value of the photosensor 107 is converted into a value that represents the exposure energy of the light source 101. The converted value is input to a main controller 103 (computer), which controls an exposure apparatus main body, through the illumination system controller 108. A pattern corresponding to a circuit pattern of a semiconductor device is formed on the mask (reticle) 109 as an original and illuminated by the illumination optical system 104.

The projection optical system 110 reduces the size of a circuit pattern image formed on the mask 109 using a reduction factor β (for example, β=½) and projects the image so as to focus the image onto one of areas of a wafer 115 to be shot, which is a photosensitive substrate onto which a photoresist has been applied. An aperture stop 111 having a substantially circular opening is disposed on a pupil plane (Fourier transform plane for the mask 109) of the projection optical system 110. The size of a diameter of the opening of the aperture stop 111 is controlled by a drive mechanism 112 such as an actuator, thereby allowing a desired size of the opening to be set.

A drive device 113, which uses an actuator or the like, moves an optical element included in the projection optical system 110. By moving the optical element of the projection optical system 110, imaging characteristics of the projection optical system 110 can be adjusted. Thus, degradation of aberrations can be avoided while projection magnification can be improved. A projection system controller 114 controls the drive mechanism 112 and the drive device 113.

A substrate stage 116 supports the wafer 115 such that the wafer 115 is movable in three dimensional directions, that is, in an optical axis direction (Z-direction) of the projection optical system 110 and on a plane (X-Y plane) perpendicular to the optical axis direction of the projection optical system 110. The position of the substrate stage 116 on the X-Y plane is detected by measuring the distance to a moving mirror 117 secured to the substrate stage 116 using a laser interferometer 118. A stage controller 120 detects the position of the substrate stage 116 using the laser interferometer 118 and controls a drive mechanism 119, which uses a motor or the like, thereby moving the substrate stage 116 to a specified position on the X-Y plane. The main controller 103 controls the light source 101, the illumination system controller 108, the projection system controller 114, and the stage controller 120 via electrical connection. The main controller 103 includes an exposure coefficient storage section 123 (storage unit), which will be described later.

A flood optical system 121 and a detection optical system 122 are included in a focal plane detection unit. The flood optical system 121 projects a plurality of light beams of non-exposure light of a wavelength to which the photoresist on the wafer 115 is not sensitive. The beams of light are each converged on the wafer 115 and reflected. The beams reflected by the wafer 115 are incident upon the detection optical system 122. The detection optical system 122 includes therein a plurality of position-detecting photodetectors corresponding to the respective reflected beams. A light receiving surface of each position-detecting photodetector and each of points on the wafer 115 at which the beams are reflected are substantially conjugated by an imaging optical system. A shift in a position on a surface of the wafer 115 in the optical axis direction of the projection optical system 110 is measured as a shift in a position of the beam incident upon the position-detecting photodetector in the detection optical system 122.

Next, fluctuation in the imaging characteristic of the projection optical system 110 is described.

The projection optical system 110 absorbs part of energy of the exposure light. A temperature change occurs in the projection optical system 110 due to heat produced through the absorption of energy of the exposure light, thereby fluctuating the imaging characteristics of the projection optical system 110.

Figure 3:
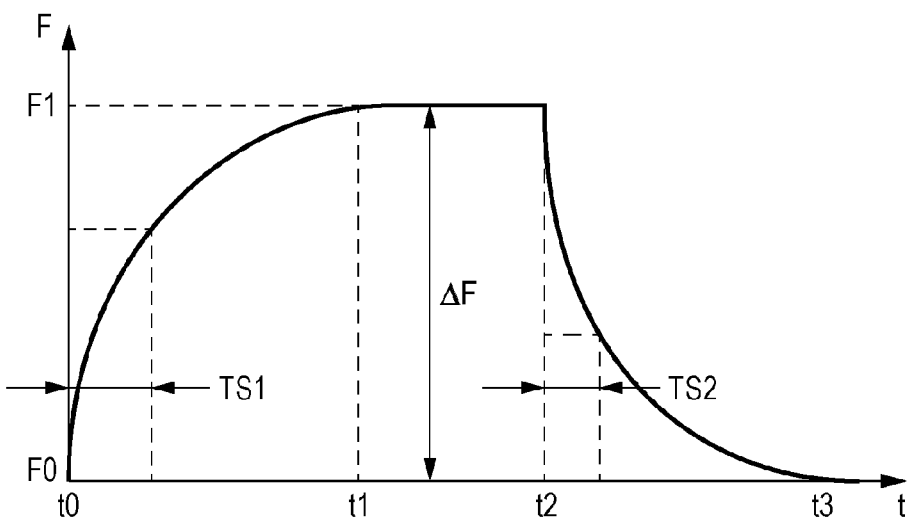
FIG. 3 illustrates an example of a time-varying fluctuation of an imaging characteristic of a projection optical system occurring due to exposure.

FIG. 3 illustrates an example of a time-varying fluctuation of an aberration of the projection optical system 110 occurring due to exposure. The horizontal axis represents time t and the vertical axis represents the amount of aberration F at a certain image height of the projection optical system 110. The amount of fluctuation of aberration is given by ΔF, which typically differs for different image heights. It is assumed that F0 represents an initial aberration amount as an imaging characteristic value of the projection optical system 110. When exposure starts from time t0, the aberration of the projection optical system 110 fluctuates as time elapses, and is stabilized at an aberration amount F1 at time t1. After that, even when irradiation of the projection optical system 110 with the exposure light is continued, energy absorbed by the projection optical system 110 to be transformed into heat and heat energy released from the projection optical system 110 are balanced. Thus, the aberration amount does not fluctuate from F1. Then, when the exposure is stopped at time t2, the aberration amount decreases as time elapses, and returns to the initial aberration amount F0 at time t3.

Time constants TS1 and TS2 illustrated in FIG. 3 are equal to time constants for heat transfer characteristics of the projection optical system 110. These time constants, which are specific to the projection optical system 110 and differ among the imaging characteristics, are obtained on an apparatus-by-apparatus basis for each imaging characteristic during inspection of the imaging characteristics of the projection optical system 110.

The amount of aberration fluctuation $\Delta F$ (the amount of fluctuation from F0 to F1) changes in proportion to the amount of exposure energy with which the projection optical system 110 is irradiated. Thus, the aberration fluctuation amount $\Delta F$ can be expressed in the following expression (1):

$$\Delta F = K \times Q \quad (1)$$

where K is the amount of fluctuation of the imaging characteristic per unit energy of the exposure light (exposure coefficient), and Q is exposure energy with which the projection optical system 110 is irradiated.

When the aberration amount at a particular time is given by $\Delta F_k$, the aberration amount $\Delta F_{k+1}$ after being exposed to light for a period of time $\Delta t$ from the particular time is approximated by the following expression:

$$\Delta F_{k+1} = \Delta F_k + \Delta F \times (1 - \exp(-\Delta t / TS1)) \quad (2)$$

where TS1 and TS2 are time constants saved for each aberration fluctuation amount $\Delta F$ and each imaging characteristic.

Likewise, when the projection optical system 110 is not exposed to light for a period of time $\Delta t$, $\Delta F_{k+1}$ can be approximated by the following expression:

$$\Delta F_{k+1} = \Delta F_k \times \exp(-\Delta t / TS2) \quad (3).$$

By modeling a curve expressing the fluctuation of the imaging characteristic of the projection optical system 110 illustrated in FIG. 3 using the functions of the above-described expressions (1), (2), and (3), fluctuation of the imaging characteristic of the projection optical system 110 caused by heat due to exposure to light is estimated. The model expressions (1), (2), and (3) are examples in the present embodiment. Alternatively, as expressions modeling fluctuation of the imaging characteristic of the projection optical system 110 due to exposure to light, other known model expressions can be used.

The models of fluctuation of the imaging characteristic of the projection optical system 110 include an exposure model that represents fluctuation of the imaging characteristic while the exposure light illuminates the projection optical system 110 and non-exposure model that represents fluctuation of the imaging characteristic while illumination of the projection optical system 110 with the exposure light is stopped. The former is represented by the expression (2) and the latter is represented by the expression (3).

Next, an exposure coefficient K is described. The exposure coefficient K is defined for each of a plurality of imaging characteristics (for example, focusing, magnification, distortion aberration, astigmatism, spherical aberration, coma aberration, and the like) of the projection optical system 110. Furthermore, the exposure coefficient K is defined for individual exposure conditions. Here, the exposure conditions include NA of the projection optical system 110, NA of the illumination optical system 104, distribution of effective light source formed on the pupil plane of the illumination optical system 104, the pattern of the mask 109, regions of the mask 109 to be irradiated, a center position, and so forth. The reason is that, when these exposure conditions are changed, distribution of energy density of light incident upon the projection optical system 110 changes, and as a result, the amount of fluctuation of each imaging characteristic of the projection optical system 110 and their dependency on the image height are changed. The exposure energy Q is determined in accordance with the conditions under which the exposure energy is determined (wafer exposure time, the amount of exposure, stage scanning speed, information (size) on exposed regions of the mask 109, and so forth).

Figure 4:
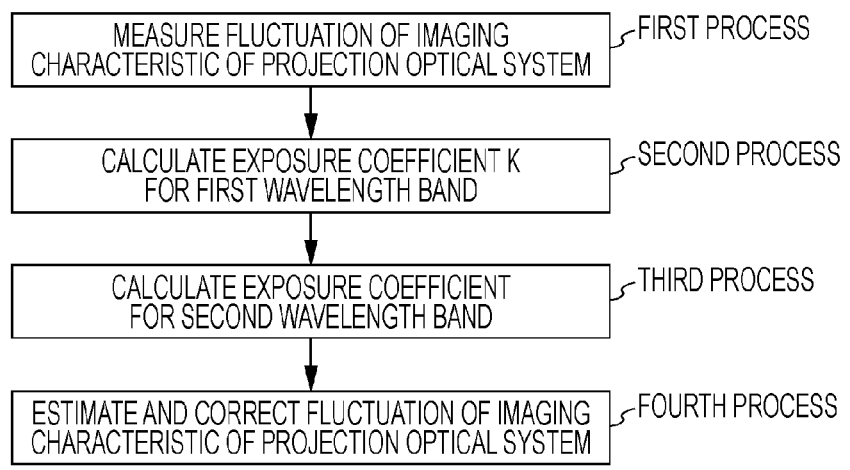
FIG. 4 illustrates processes in which a fluctuation of the imaging characteristic of the projection optical system is measured.

Next, a first to fourth processes are described below with reference to FIG. 4.

Figure 5:
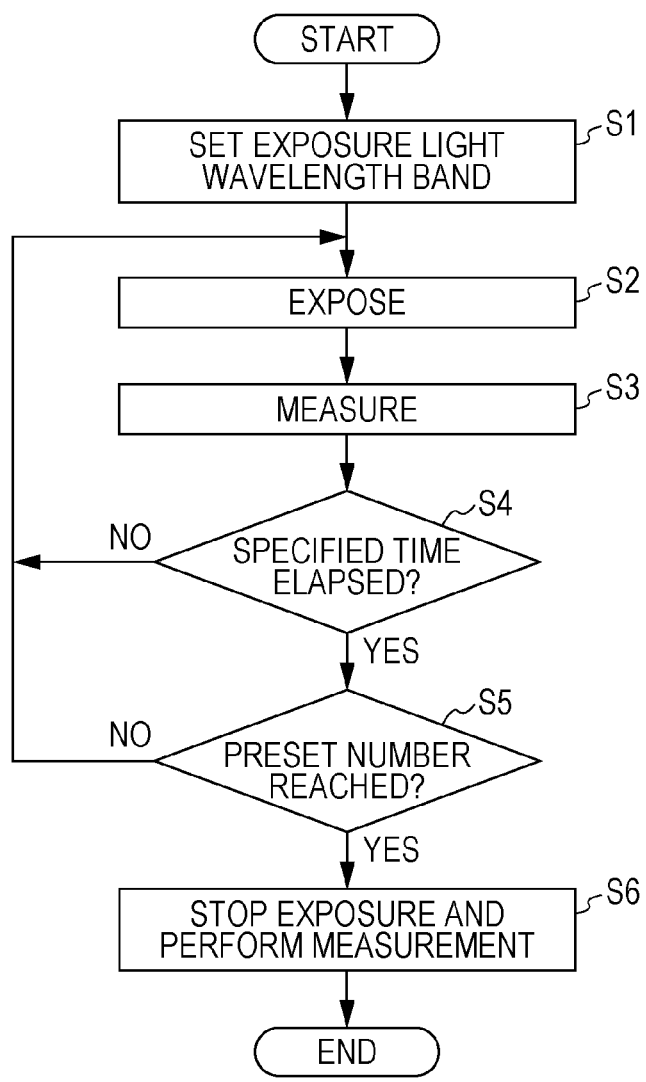
FIG. 5 illustrates steps in which the fluctuation of the imaging characteristic of the projection optical system is measured.

First, referring to a flowchart illustrated in FIG. 5, a process of measuring fluctuation of the imaging characteristic of the projection optical system 110 (first process) is described. In this measurement process, the wavelength of the exposure light with which the wafer 115 is irradiated is set to a specified wavelength band (first wavelength band) so as to measure fluctuation of the imaging characteristic of the projection optical system 110 with respect to the first wavelength band using the exposure light of the first wavelength band under control of the main controller 103.

The wavelength of the exposure light is initially set to the first wavelength band using the exposure light wavelength changing unit 102 (S1). The exposure light wavelength changing unit 102 arranges a filter that transmits only light of the first wavelength band out of light from the light source 101 in the optical path so as to set the wavelength of the exposure light to the first wavelength band. Next, after initial measurement, exposure is performed and the imaging characteristic is measured (S2 and S3). In S2, the wafer 115 is exposed to the light through the mask 109 on which a pattern for measurement is formed. In S3, line widths, shapes and like of the pattern formed on the wafer 115 are measured with measuring device. Then, using data obtained by measurement, the value of the imaging characteristic (the amount of fluctuation) is calculated.

In S4, the main controller 103 determines whether or not specified time predetermined as time for which the wafer 115 is to be exposed has elapsed. If the specified time has not elapsed, S2 and S3 are repeated. If the specified time has elapsed, processing advances to S5.

In S5, the main controller 103 determines whether or not a number, which is preset as the number of measurements, has been reached. If the preset number has not been reached, S2 and S3 are repeated. If the preset number has been reached, exposure is ended. Thus, S2 and S3 are repeated until the specified time has elapsed and the preset number has been reached, thereby obtaining time-discrete data of the fluctuation of the imaging characteristic.

Next, after the exposure is stopped, the amount of fluctuation of the imaging characteristic is measured until the imaging characteristic value of the projection optical system 110 returns to the initial value F0 measured at the start of exposure (S6).

When data of fluctuation of plural types of imaging characteristics is desired, each of the imaging characteristics is similarly measured. An interval between measurements, the specified time, and the preset number vary depending on the apparatus or aberration to be corrected.

Next, a process (second process) in which the exposure coefficient K for the first wavelength band is calculated using the measurement data of the fluctuation of the imaging characteristic obtained in the first process is described.

An approximate expression of the fluctuation of the imaging characteristic is initially calculated using the measurement data of the fluctuation of the imaging characteristic obtained in the first process. The approximate expression is determined so that a residual error from the measurement data of the fluctuation of the imaging characteristic is minimized. Then, the amount of fluctuation ΔF of the imaging characteristic is calculated in accordance with the approximate expression. Then, in accordance with the expression (1), the amount of fluctuation ΔF is divided by the exposure energy value Q so as to obtain the value of the exposure coefficient K.

Figure 6A:
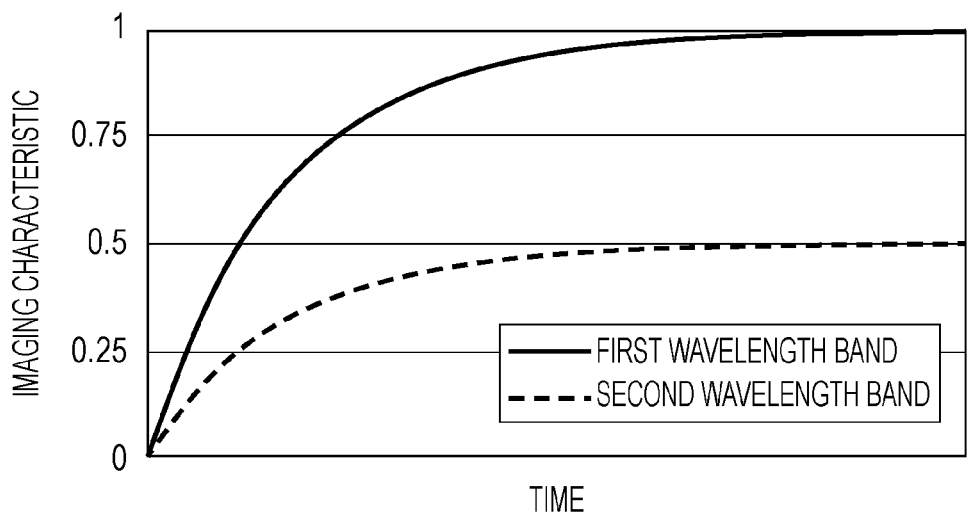
FIGS. 6A and 6B illustrate the difference in time-varying fluctuation of the imaging characteristic caused by the difference in wavelength band.
Figure 6B:
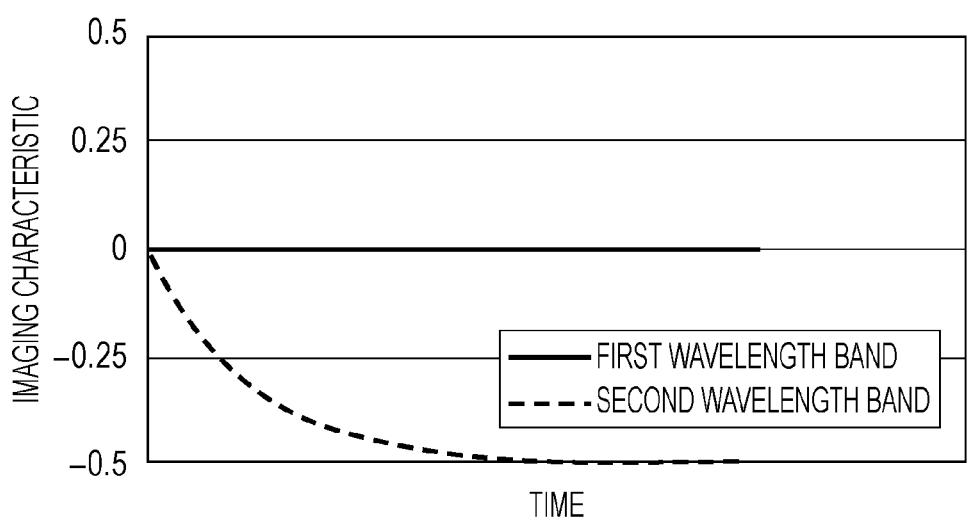

Next, a process (third process), in which the exposure coefficient for a second wavelength band is calculated, is described. The wavelengths of the second wavelength band are different from those of the first wavelength band. It is assumed, for example, the first wavelength band includes the i-line, and the second wavelength band includes the h-line. The wavelength bands different from each other exhibit, even when the exposure conditions are the same, different amounts of fluctuation of the imaging characteristic due to the difference in intensity of light output from the light source 101 and the difference in optical characteristics such as the transmittance of an optical element included in the projection optical system 110 with respect to the wavelengths. FIG. 6A illustrates a time-varying fluctuation of the imaging characteristic with the first wavelength band and a time-varying fluctuation of the imaging characteristic with the second wavelength band. The amount of fluctuation of the imaging characteristic is estimated with the aforementioned expressions (1), (2), and (3). For this reason, when the amount of fluctuation of the imaging characteristic with the second wavelength band is estimated using the exposure coefficient for the first wavelength band, an error occurs as illustrated in FIG. 6B.

Thus, the exposure coefficient for the second wavelength band is calculated by utilizing the exposure coefficient for the first wavelength band with consideration of the difference in intensity of the exposure light, the difference in optical characteristics of the optical element included in the projection optical system 110, for example, the transmittance with respect to the wavelengths, and the like. When the strength of the exposure light of the first wavelength band used in the first process is $\alpha 1$, the strength of the exposure light of the second wavelength band is $\alpha 2$, and with respect to the light transmittance of the projection optical system 110, the transmittance for light in the first wavelength band is $\beta 1$, the transmittance for light in the second wavelength band is $\beta 2$, the exposure coefficient for the first wavelength band, which is the reference exposure coefficient, is $K(1)$, the exposure coefficient $K(2)$ for the second wavelength band can be obtained by the following expression (4):

$$K(2)=K(1)\times(\alpha 2/\alpha 1)\times(\beta 2/\beta 1) \quad (4).$$

The calculated exposure coefficients $K(1)$ and $K(2)$ are stored in the exposure coefficient storage section 123 of the main controller 103. That is, the exposure coefficient storage section 123 may be understood as a memory device (storage unit), such as random access memory that allows for storing and accessing of data corresponding to the calculated exposure coefficients $K(1)$ and $K(2)$. Although the exposure coefficient for the second wavelength band is calculated from the exposure coefficient for the first wavelength band using the intensity ratio and the transmittance ratio, the exposure coefficient for the second wavelength band can be calculated using parameters other than the intensity ratio and the transmittance ratio.

As described above, exposure coefficients for exposure light of desired wavelength bands can be calculated by only actually measuring an imaging characteristic using the exposure light of the first wavelength band. Thus, time taken for measurement can be reduced.

Next, a process of estimating and correcting the fluctuation of the imaging characteristic of the projection optical system 110 (fourth process) using the exposure coefficient is described.

The exposure light wavelength changing unit 102 is initially set so that the exposure apparatus can actually illuminate the wafer 115 at a set wavelength in accordance with data input by a user. For example, data relating to a wavelength to be used is input from an input screen or the like by the user, and the exposure light wavelength changing unit 102 selects an adequate filter in accordance with the input data and arranges the filter in the optical path.

As is the case with the above-described third process, using the data relating to the wavelength of the exposure light to be used, the main controller 103 calculates the exposure coefficient for the second wavelength band from the exposure coefficient for the first wavelength band stored in the exposure coefficient storage section 123 thereof. Time-varying fluctuation of the imaging characteristic during exposure and non-exposure is estimated from the calculated exposure coefficient K and exposure energy Q using the expressions (2) and (3). Using the estimation data, the main controller 103 calculates control information so as to reduce effects produced by the amount of fluctuation of the imaging characteristic and controls movable part (at least one of the optical element of the projection optical system 110, a mask stage, and the substrate stage 116). In the case where the movable part is controlled before the exposure, the control information can be calculated with consideration of effects of pressure of surrounding gas around the projection optical system 110 on the projection optical system 110 caused by a pneumatic sensor and the amounts of offset set to the exposure apparatus on an apparatus-by-apparatus basis.

As described above, in the present embodiment, the exposure coefficient (model expression) is obtained with consideration of characteristic of the exposure light of each wavelength band. Thus, the amount of fluctuation of the imaging characteristic of the projection optical system 110 can be more accurately obtained. Accordingly, effects produced by the amount of fluctuation of the optical characteristic can be further reduced.

Although the technology herein is applied to a case where the wafer 115 is exposed to exposure light of the second wavelength band in the above-described example, this is not limiting application of the technology. The technology herein is also applicable to a case where the wafer 115 is exposed to exposure light including light of the first wavelength band and the second wavelength band.

In the case where the wafer 115 is exposed to the exposure light that includes light of the first and second wavelength bands, the main controller 103 (calculation unit) calculates a composite exposure coefficient $K(1+2)$ for the exposure light including light of the first and second wavelength bands using the exposure coefficients $K(1)$ and $K(2)$, which have been stored.

When the wafer 115 is exposed to light, the intensities of light of the first wavelength band and light of the second wavelength band of the exposure light are set in accordance with a required depth of focus and a resolution of pattern. Thus, the exposure coefficients need to be calculated in accordance with these intensities. The intensities of the exposure light of the first and second wavelength bands actually transmitted through the projection optical system 110 are determined in accordance with the transmittance characteristics of the filter of the exposure light wavelength changing unit 102.

Using a ratio $\epsilon 1$ for the first wavelength band and a ratio $\epsilon 2$ for the second wavelength band, the composite exposure coefficient K(1+2) is calculated by an expression (5) as follows:

$$K(1+2)=\epsilon 1 \times K1 + \epsilon 2 \times K2 \qquad (5).$$

A case where $\epsilon 1$ is zero is a case where exposure is performed with the exposure light includes only light of the second wavelength band; a case where $\epsilon 2$ is zero is a case where exposure is performed with the exposure light includes only light of the first wavelength band. $\epsilon 1$ and $\epsilon 2$ are arbitrary values calculated by setting in accordance with, for example, multiplication of the intensity of the exposure light of wavelength bands actually used and transmittances of the projection optical system 110 with respect to the respective wavelength bands.

Although the two wavelength bands, that is, the first wavelength band and the second wavelength band have been described, the composite exposure coefficient can be calculated for not only two wavelength bands; the composite exposure coefficient can be similarly calculated also for three or more wavelength bands. For example, when the ratio for each wavelength band is represented by $\epsilon n$ (n=1, 2, 3 . . . ), a composite exposure coefficient Kx for arbitrary wavelength bands can be calculated as expressed by an expression (6):

$$Kx = \Sigma \epsilon n \times K(n)(n=1,2,3 \ldots) \qquad (6).$$

The exposure light wavelength changing unit 102 is set so that the wafer 115 can be actually exposed to light of set wavelengths in accordance with the data input by the user. Using the data relating to wavelengths of the exposure light to be used, the main controller 103 obtains the ratio (exposure coefficient) for each wavelength band stored in the exposure coefficient storage section 123 thereof so as to calculate a composite exposure coefficient for exposure light to be actually used. Time-varying fluctuation of the imaging characteristic during exposure and non-exposure is estimated from the calculated composite exposure coefficient K and exposure energy Q using the expressions (2) and (3). Using the estimation data, the main controller 103 calculates the control information so as to reduce effects produced by the amount of fluctuation of the imaging characteristic and controls movable part (at least one of the optical element of the projection optical system 110, the mask stage, and the substrate stage 116).

Next, a method of controlling the movable part is described. The projection optical system 110 includes a driver attached thereto that drives the optical element in desired directions in order to dynamically correct imaging characteristics. The control information calculated by the main controller 103 is transmitted to the projection optical system 110, thereby permitting the optical element to be driven in desired directions so as to correct aberration that has occurred. Furthermore, when, for example, the focus of the projection optical system 110 fluctuates, the main controller 103 transmits a correction amount to the stage controller 120 so that a surface of the wafer 115 is the best focused position. The substrate stage 116, on which the wafer 115 is positioned, is driven in the Z-direction or inclined so as to control the position and posture of the wafer 115 and the substrate stage 116. Furthermore, the projection optical system 110 and the mask stage, on which the mask 109 is positioned, can be controlled by the controllers.

In the present embodiment, a method in which the imaging characteristic that fluctuates is corrected by driving the movable part has been described. However, the method is not limited to the above description. It is possible to store in the main controller 103 a threshold value for the amount of fluctuation of the imaging characteristic and reduce the amount of exposure when the estimated amount of fluctuation exceeds the threshold value, or to directly reduce the amount of fluctuation through adjustment of exposure load by, for example, stopping exposure.

Although models for fluctuation and correction of the amount of fluctuation at a certain image height have been described, the amount of fluctuation at an arbitrary image height can be estimated and corrected using a related-art fluctuation model in accordance with image heights.

When the above-described conditions for exposure are changed, the exposure coefficient is calculated in accordance with each of the exposure conditions. Under the same exposure conditions, the amount of fluctuation of the imaging characteristic can be precisely estimated as described above, and accordingly, the wafer 115 can be exposed to light in a good state.

Second Embodiment

Next, a method of fabricating a device (semiconductor device, liquid crystal display device, or the like) according to an embodiment of the present invention is described. Here, a method of fabricating a semiconductor device is described in an example.

A semiconductor device is fabricated through a front-end process, in which integrated circuits are fabricated in a wafer, and a back-end process, in which each of the integrated circuit chips fabricated in the wafer in the front-end process is completed as a product. The front-end process includes a step of exposing the wafer to the light, onto which a photoresist has been applied, using the aforementioned exposure apparatus and a step of developing the wafer. In the exposing step, as described above, the wafer is exposed to light while the amount of fluctuation of the imaging characteristic of the projection optical system 110 is estimated so as perform control such that the amount of fluctuation is reduced. The back-end process includes a step of assembling (dicing and bonding) and a step of packaging (encapsulating). The liquid crystal display device is fabricated through a process in which transparent electrodes are formed. The process of forming transparent electrodes includes a step of applying a photoresist onto a glass substrate onto which a transparent electroconductive film is formed by evaporation, a step of exposing the glass substrate, onto which the photoresist has been applied, using the above-described exposure apparatus, and a step of developing the glass substrate. With the method of fabricating a device according to the present embodiment, a device, the grade of which is higher than that of a device fabricated through a related-art method, can be fabricated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-262273, filed Nov. 30, 2011, which is hereby incorporated by reference herein in its entirety.

What is claimed is:

1. A method of fabricating a device, the method comprising the steps of:
    exposing a substrate to light using an exposure apparatus and by controlling an imaging characteristic of a projection optical system; and
    developing the substrate having been exposed to the light
    wherein the exposure apparatus comprises
        an illumination optical system that illuminates a mask using the light from a light source;
        the projection optical system that projects an image of a pattern of the mask onto the substrate;
        a storage unit that stores an exposure coefficient for a first wavelength band of exposure light and an exposure coefficient for a second wavelength band of the exposure light, the second wavelength band being different from the first wavelength band, the substrate being exposed to the exposure light, each exposure coefficient being defined as an amount of fluctuation of an imaging characteristic of the projection optical system per unit of exposure energy; and
        a calculation unit that calculates the amount of fluctuation of the imaging characteristic of the projection optical system,
    wherein the storage unit stores the exposure coefficients for the first and second wavelength bands, the exposure coefficient for the first wavelength band is calculated using data of the amount of fluctuation of the imaging characteristic of the projection optical system in a case where the exposure light is light of the first wavelength band, and the exposure coefficient for the second wavelength band is calculated using the exposure coefficient for the first wavelength band, and
    wherein the calculation unit calculates the amount of fluctuation of the imaging characteristic of the projection optical system using the exposure coefficient for the second wavelength band in a case where the substrate is exposed to exposure light of the second wavelength band.

2. A method of calculating an amount of fluctuation of an imaging characteristic of a projection optical system of an exposure apparatus, the exposure apparatus irradiating a mask using light from a light source and projecting an image of a pattern of the mask onto a substrate using the projection optical system, the method comprising the steps of:
    calculating an exposure coefficient for a first wavelength band by using data of the amount of fluctuation of the optical characteristic of the projection optical system in a case where exposure light to which the substrate is exposed is light of the first wavelength band, the exposure coefficient being defined as the amount of fluctuation of the imaging characteristic of the projection optical system per unit of exposure energy;
    calculating an exposure coefficient for a second wavelength band that is different from the first wavelength band using the exposure coefficient for the first wavelength band; and
    calculating the amount of fluctuation of the imaging characteristic of the projection optical system using the exposure coefficient for the second wavelength band in a case where the substrate is exposed to the exposure light of the second wavelength band.

3. The method according to claim 2, further comprising the step of:
    calculating a composite exposure coefficient in accordance with an intensity of the light of the first wavelength band, an intensity of the light of the second wavelength band, and a transmittance of the projection optical system for the exposure light that includes the light of the first wavelength band and the light of the second wavelength band using the exposure coefficient for the first wavelength band and the exposure coefficient for the second wavelength band,
    wherein the amount of fluctuation of the imaging characteristic of the projection optical system is calculated using the composite exposure coefficient in a case where the substrate is exposed to the exposure light that includes the light of the first wavelength band and the light of the second wavelength band.

4. The method according to claim 2,
    wherein, in the calculating the exposure coefficient for the first wavelength band, the exposure coefficient is calculated by dividing the amount of fluctuation of the imaging characteristic of the projection optical system by an amount of exposure energy.

5. The method according to claim 2,
    wherein the exposure coefficient for the second wavelength band is calculated using a ratio of the intensity of the light of the second wavelength band to the intensity of the light of the first wavelength band and a ratio of transmittance of the projection optical system for the second wavelength band to a transmittance for the first wavelength band.

* * * * *